United States Patent
Colgan et al.

(10) Patent No.: US 10,249,516 B2
(45) Date of Patent: *Apr. 2, 2019

(54) UNDERFILL DISPENSING USING FUNNELS

(71) Applicant: INTERNATIONAL BUSINESS MACHINES CORPORATION, Armonk, NY (US)

(72) Inventors: Evan George Colgan, Montvalle, NJ (US); Michael Anthony Gaynes, Vestal, NY (US); Katsuyuki Sakuma, Fishkill, NY (US); Donald Alan Merte, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/643,700

(22) Filed: Jul. 7, 2017

(65) Prior Publication Data
US 2017/0309538 A1    Oct. 26, 2017

Related U.S. Application Data

(63) Continuation of application No. 15/072,957, filed on Mar. 17, 2016, now Pat. No. 9,852,960.

(51) Int. Cl.
*H01L 23/31* (2006.01)
*H01L 21/56* (2006.01)
*H01L 21/67* (2006.01)
*H01L 21/60* (2006.01)

(52) U.S. Cl.
CPC .. *H01L 21/563* (2013.01); *H01L 2021/60022* (2013.01); *H01L 2224/16227* (2013.01); *H01L 2924/15311* (2013.01)

(58) Field of Classification Search
CPC ... H01L 24/83; H01L 23/3185; H01L 21/563; H01L 2021/60022; H01L 2224/32145; H01L 2924/15311; H01L 2924/18161
See application file for complete search history.

(56) References Cited

U.S. PATENT DOCUMENTS

| | | | |
|---|---|---|---|
| 9,852,960 B2* | 12/2017 | Colgan | H01L 23/3185 |
| 2009/0079060 A1* | 3/2009 | Bartley | H01L 21/563 257/703 |
| 2016/0086902 A1* | 3/2016 | Lu | H01L 24/14 257/737 |

OTHER PUBLICATIONS

List of IBM Patents or Patent Applications Treated as Related dated Jul. 7, 2017, 2 pages.

* cited by examiner

*Primary Examiner* — Jasmine Clark
(74) *Attorney, Agent, or Firm* — Tutunjian & Bitetto, P.C.; Erik Johnson

(57) ABSTRACT

Arrays of objects on a substrate having void-free underfill as well as methods and systems of forming the same include forming a void-free layer of underfill material between a substrate and an array of multiple objects positioned on the substrate. The void-free layer of underfill material is cured to form a protective cured underfill layer that provides structural support to connections between the objects and the substrate.

11 Claims, 6 Drawing Sheets

UNDERFILL DISPENSING USING FUNNELS

STATEMENT REGARDING FEDERALLY SPONSORED RESEARCH OR DEVELOPMENT

This invention was made with Government support under Contract No.: H98230-13-D-0122 awarded by the Maryland Procurement Office. The Government has certain rights to this invention.

BACKGROUND

Technical Field

The present invention relates to chip underfills and, more particularly, to methods and devices for uniformly dispensing an underfill to an array of laminates on a wafer without voids.

Description of the Related Art

Underfill is used when electrically interconnecting a chip to, for example, a substrate or intermediate laminate. The underfill is often an epoxy or other curable resin that is designed to protect solder interconnects from, for example, fatigue due to cyclic strain during manufacturing and electrical test processing, reliability testing, and operational thermal cycles. The underfill also protects the fragile back-end-of-line (BEOL) chip structure.

SUMMARY

A method for underfilling an array of objects on a substrate includes forming a void-free layer of underfill material between a substrate and an array of multiple objects positioned on the substrate. The void-free layer of underfill material is cured to form a protective cured underfill layer that provides structural support to connections between the objects and the substrate.

A system for underfilling an array of objects on a substrate includes a plurality of funnels disposed at multiple points of a substrate, each having a funnel reservoir. A dispenser is configured to maneuver an underfill dispensing nozzle to each of the funnels in sequence and to dispense underfill material into each respective funnel reservoir.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide underfill to multiple laminates, or chips, in such a way as to prevent gaps and voids in the underfill. To accomplish this, multiple funnels are used that locally deliver the underfill material to the appropriate layer in a controlled manner. Not only does this make it possible to create a consistent, gap-free underfill layer across an entire wafer, or multi-chip substrate, but each funnel can be filled and left to deposit underfill while the next funnel is being filled, introducing parallelization to underfill deposition and greatly speeding the process. The present embodiments are described as having multiple laminates mounted on a common wafer, but it should be understood that the invention is equally applicable to an array of chips mounted on a common substrate.

Figure 1:
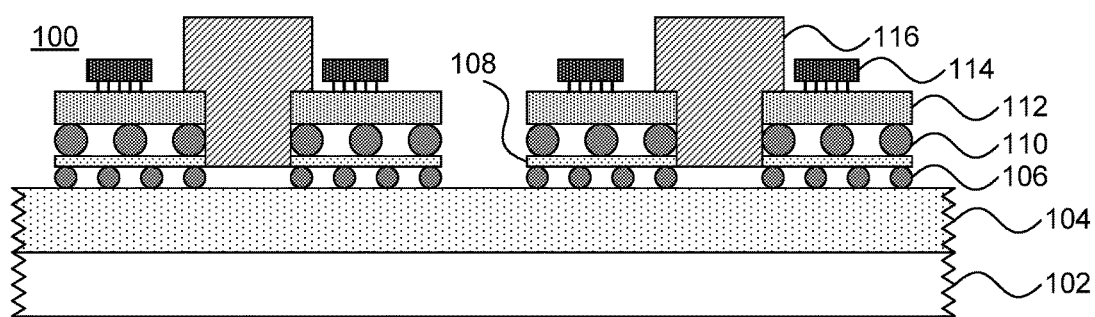
FIG. 1 is a cross-sectional diagram of a multi-laminate array with underfill deposition funnels in accordance with the present principles.

Referring now to FIG. 1, a cross-sectional view of an array of laminates on a wafer 100 is shown. A substrate is formed from, for example, an insulator layer 102 and a semiconductor layer 104. In one specific embodiment, the insulator layer 102 may be a glass layer and the semiconductor layer 104 may be a silicon-containing material. In an alternative embodiment, a bulk semiconductor substrate may be used instead. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multilayers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide.

On the semiconductor layer 104 is mounted an array of separate laminates 108. The laminates 108 may be bonded to the semiconductor layer 104 via a set of solder connection points 106. It is specifically contemplated that the laminates 108 may be mounted by flip chip bonding and that the solder connection points 106 may be controlled collapse chip connections (known as "C4") solder points. The laminates 108 may be formed from an organic material or any other appropriate intermediate material and may include multiple conductor and insulator layers.

A set of printed circuit boards 112 (PCBs) are then attached to respective similarly sized laminates 108. The PCBs 112 are connected to the laminated by a set of solder points 110. Notably these solder points 110 form what is known as a ball grid array (BGA) and are contemplated as being larger than the C4 solder points 106. One or more additional integrated chips 114 may be attached to the PCB 112 by any mechanism including, for example, pins, surface mounting solder joints, etc.

Packaging an array of laminates on a wafer in this manner is challenging because there is usually a large mismatch in the coefficients of thermal expansion between the semiconductor layer 104 (e.g., about 2.8 ppm/° C. for silicon) and the laminate (e.g., about 17 ppm/° C.). Attaching an entire array of such laminates across, e.g., a 300 mm wafer makes this prospect particularly challenging. The length scale of a wafer-scale package can be more than ten times greater that of a single flip-chip-on-laminate package.

An underfill material may be added to protect the connections, e.g., between the laminate 108 and the substrate 104 or between the PCB 112 and the laminate 108. The underfill may be selected and processed so that the underfill reaches the target gap only. If a high glass transition temperature underfill is used, the large mismatch in the coefficients of thermal expansion between the semiconductor layer 104 and the laminate 108 generates thermal mechanical stress because of the mechanical link from the cured underfill and can result in horizontal wafer cleavage. Additionally, underfill delamination can result between the underfill and the chip when a lower temperature cure is performed and the underfill has a low glass transition temperature.

The underfill material is to be deposited between, e.g., the laminates 108 and the substrate 104. However, the presence of the solder points 106 and the small gap between the laminates 108 and the substrate 104 impede the flow of the underfill. In contrast, the spaces between laminates 108 are relatively unimpeded. A result of this difference is that underfill material tends to spread more quickly in the channels between the laminates 108 than it does underneath the laminates.

This poses a difficulty when attempting to underfill multiple devices. While the devices directly adjacent to the fill point will receive underfill relatively quickly, for devices that are farther away the underfill will rapidly fill the channels first. If the underfill surrounds the chip before fully filling the space between the laminate 108 and the substrate 104, a void may be formed by air that is trapped underneath.

Another potential problem is that underfill may also spread between the laminate 108 and the PCB 112. In practice, the different layers are very thin and located very close together, with gaps between them potentially being so small as to be difficult to see with the naked eye. Without precise control over deposition location, underfill material can escape between unintended layers. When underfill escapes between the laminate 108 and the PCB 112, an unknown and unpredictable amount is lost, making it impossible to have a controlled manufacturing process for filling the target gap between the laminate 108 and the semiconductor substrate 104.

To address these problems, funnels 116 may be used to deposit the underfill material. Multiple funnels 116 may be used across the wafer, with underfill being deposited locally. This allows the deposition of the underfill material to be distributed across the wafer. Only the appropriate amount of underfill material is used at each funnel 116, preventing underfill material from accumulating in the channels between chips or overflowing between the laminate 108 and the PCB 112. Furthermore, the funnels 116 are sized to deposit the underfill material directly at the desired height. The nozzle of the funnels 116 may be sized to limit the deposition rate of the underfill material, providing a further limit on the amount of underfill material that may be lost.

Figure 2:
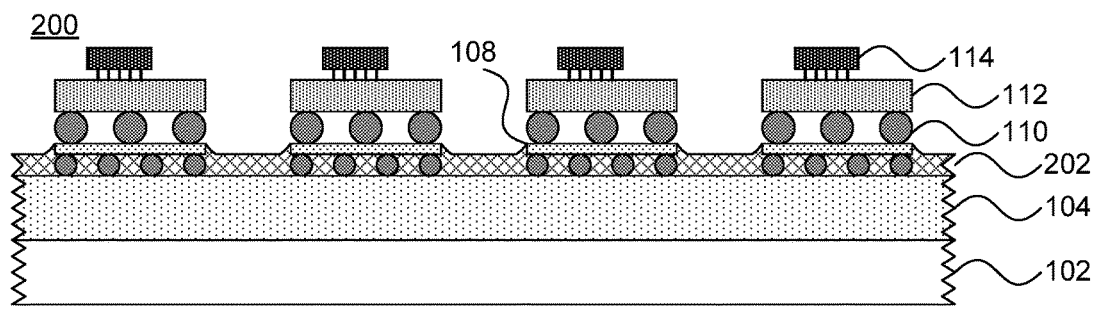
FIG. 2 is cross-sectional diagram of a multi-laminate array with a void-free underfill layer in accordance with the present principles.

Referring now to FIG. 2, a cross-sectional view of an array of laminates on a wafer 200 with underfill is shown. The underfill material 202 has been introduced and has evenly distributed across all of the chips without voids and without spreading between the laminates 108 and the PCBs 112. The funnels 116 have been removed, leaving behind an integrated wafer.

It should be recognized that this is only one embodiment and that the present principles may be extended to include providing underfill material between a laminate 108 and one or more PCBs 112 and to providing underfill material between a PCB 112 and one or more chips 114. In each case, the funnel 116 will be designed to reach to the appropriate height. It should also be understood that what has been described is equally applicable to an array of chips mounted on a common substrate, where funnels can also be used to dispense the underfill material.

After deposition of the underfill 202, the material of the underfill 202 may be cured. The cured properties of the underfill are selected to protect the solder connection points 106 from, e.g., fatigue due to cyclic stress caused by manufacturing and electrical test processing, reliability testing, and operational thermal cycles. The underfill 202 also protects the back-end-of-line (BEOL) chip structure. These two goals call for opposite properties in the underfill. For reliability testing, a high glass transition temperature $T_g$ in the cured underfill is needed, because repeated excursions above $T_g$ can cause and propagate fatigue cracking of solder joints. However, while a high $T_g$, rigid, low-expanding underfill protects the solder joints, it also would place significant thermal mechanical stress on the BEOL chip structure. A softer underfill, meanwhile, would allow higher cyclic strain on the solder joints. The opposing reliability objectives necessitate specific balancing of underfill target design cured properties, including adhesion along with the cure temperature and cure time, allowing the underfill to achieve the design properties in its coefficient of thermal expansion and glass transition temperature as well as in the ultimate adhesion of the underfill.

In one specific example, the underfill material is formulated to have a low glass transition temperature of about 80° C. This makes it possible to provide a thermal mechanical stress state that protects and maintains the structural integrity of the wafer scale package.

Underfills are cured to achieve target cured material properties. These properties may include the glass transition temperature ($T_g$), coefficient-of-thermal expansion (CTE) and modulus-of-elasticity (E). The underfill is also formulated to achieve optimum adhesion to the surfaces of the semiconductor layer 104 and the laminate 108. Thermal mechanical stress begins to develop between the low CTE semiconductor layer 104 and the higher CTE laminate 108 during cool down from curing as the cooling temperature becomes less than the $T_g$ of the cured underfill. The higher the $T_g$ of the underfill, the higher the thermal mechanical stress that develops. For example, an underfill that has a $T_g$ of 120° C. will impart higher thermal mechanical stress than an underfill that has a $T_g$ of 80° C.

High $T_g$ underfills protect the solder interconnections between the semiconductor layer 104 and the laminate 108. Low $T_g$ underfills protect the BEOL chip structure. The target $T_g$ of the underfill can be selected based on the expected chip operating temperature. A chip operating temperature that exceeds the $T_g$ of the underfill will cause cyclic strain fatigue in the solder connections and, therefore, an underfill $T_g$ should be greater than the chip operating temperature. Selecting an underfill $T_g$ that is just above the chip operating temperature will result in the least thermal mechanical stress in the BEOL chip structure.

Optimum adhesion is typically achieved by curing at higher temperatures than required to achieve target material properties. Because of the large length scale for an array of laminates on a wafer, thermal mechanical stress is minimized and adhesion strength is maximized by using a low $T_g$ underfill that can be cured at a temperature greater than 125° C. In one specific embodiment, an underfill material will have a $T_g$ that is less than 90° C., but greater than the chip operating temperature, which is controlled by the cooling solution. For a full wafer scale integrated package, liquid or two-phase cooling may be used and chip operating temperatures would be in a range of about 30° C. to about 60° C. During testing of an exemplary embodiment, it has been demonstrated that an underfill with a $T_g$ of about 80° C., a CTE of about 35 ppm/° C., and an E of about 7.2 GPa, when cured at 135° C. for six hours, results in a reliable underfill layer between a 300 mm wafer and an array of laminates. Cure of the underfill material is possible at 90° C. to achieve target material properties, but adhesion in that case was less than optimum and underfill delamination may occur with thermal cycling after cure. Maximum adhesion is developed with a 135° C. cure for six hours. In contrast, an underfill with $T_g$ of about 120° C., a CTE of about 28 ppm, and an E of about 10 GPa, cured at 150° C. for two hours resulted in horizontal wafer cleavage.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 3:
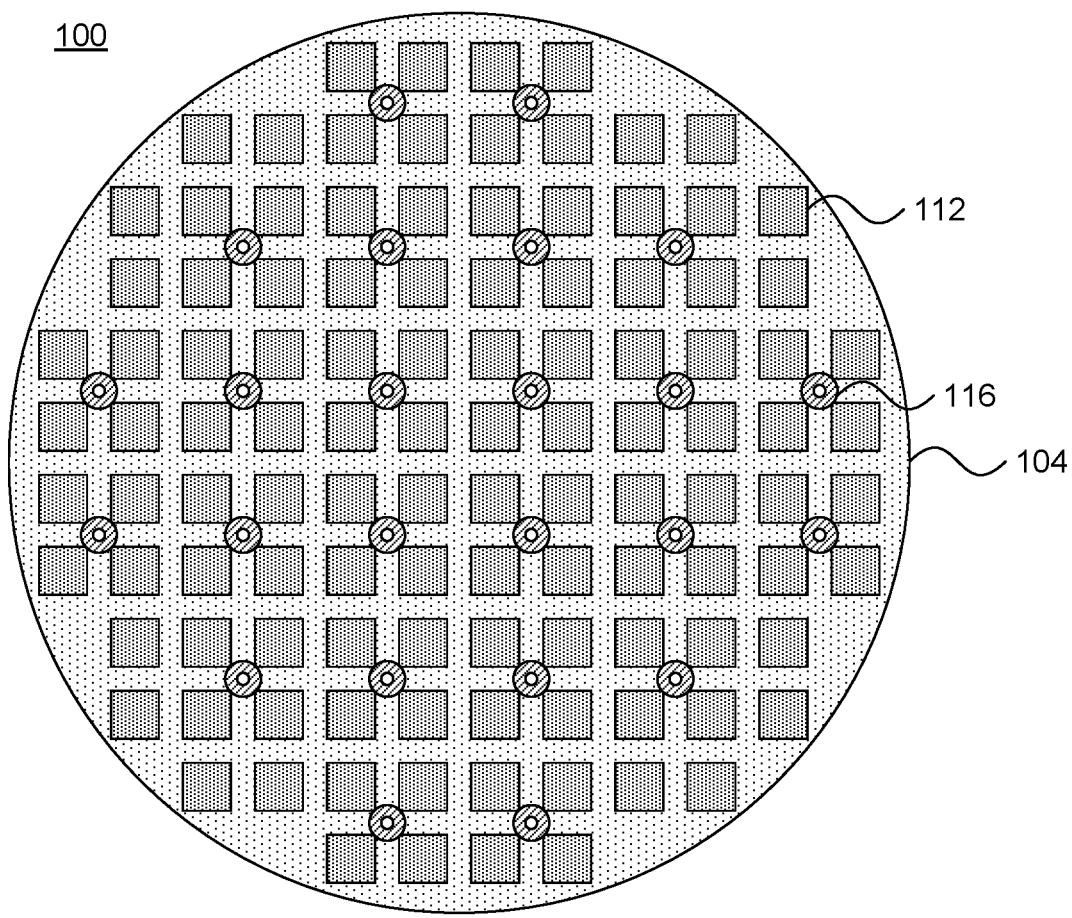
FIG. 3 is a top-down diagram of a multi-laminate array with underfill deposition funnels in accordance with the present principles.

Referring now to FIG. 3, a top-down view of the wafer 100 of FIG. 1 is shown. The funnels 116 are illustrated as being distributed evenly across the wafer 100, with their central reservoir and aperture being positioned between adjacent PCBs 112.

Figure 4:
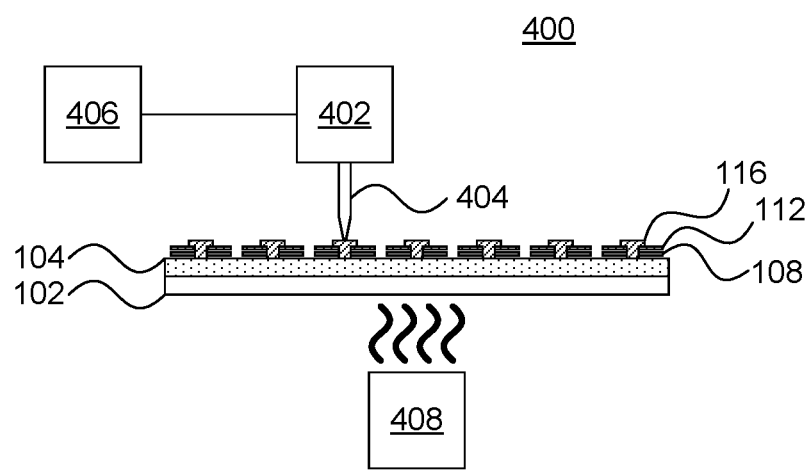
FIG. 4 is a block diagram of an underfill deposition system in accordance with the present principles.

Referring now to FIG. 4, an underfill deposition system 400 is shown. The wafer 100 is shown with funnels 116 positioned to deposit underfill material 202 between the laminates 108 and the semiconductor substrate 104. A nozzle 404 is attached to a dispensing system 402. The dispensing system 402 navigates between funnels 116, aligning the nozzle 404 with an opening of each funnel 116 and depositing underfill material into the funnel. After filling a funnel 116, the underfill material begins to flow onto the semiconductor substrate 104 and wick into the gap between the semiconductor substrate 104 and the laminates 108.

Because underfill flow is limited by an aperture in the funnel 116, the funnel reservoir can be filled rapidly, without waiting for the underfill to be fully deposited. Thus, after filling one reservoir, the dispensing system 402 navigates to the next funnel 116. In this manner, many funnels 116 may be used to deposit underfill material 202 substantially in parallel.

The dispensing system 402 may be any appropriate system for navigating the nozzle 404 over the wafer 100 and may include, for example, a robotic arm. The dispensing system 402 is controlled by a control system 406. The control system 406 may issue navigation commands according to, e.g., a pre-programmed map of the wafer 100 or by real-time sensing through, for example, one or more cameras. The control system 406 may be a separate device from the dispensing system 402, as shown, or may be formed integrally therewith.

The funnels 116 are tolerant to misalignment with respect to the nozzle 404. If, for example, the opening of the funnels 116 is large relative to the tip of the nozzle 404 (e.g., about 5 mm versus about 1 mm), then the nozzle 404 will be able to properly dispense underfill material even if the nozzle is misaligned in the horizontal plane by, e.g., 2 mm. The underfill deposition system 400 may further include a hot plate, 408, on which the wafer is positioned so that heat can be applied to lower the viscosity of the underfill, facilitating capillary flow and also to cure the underfill material 202, if desired.

Figure 5:
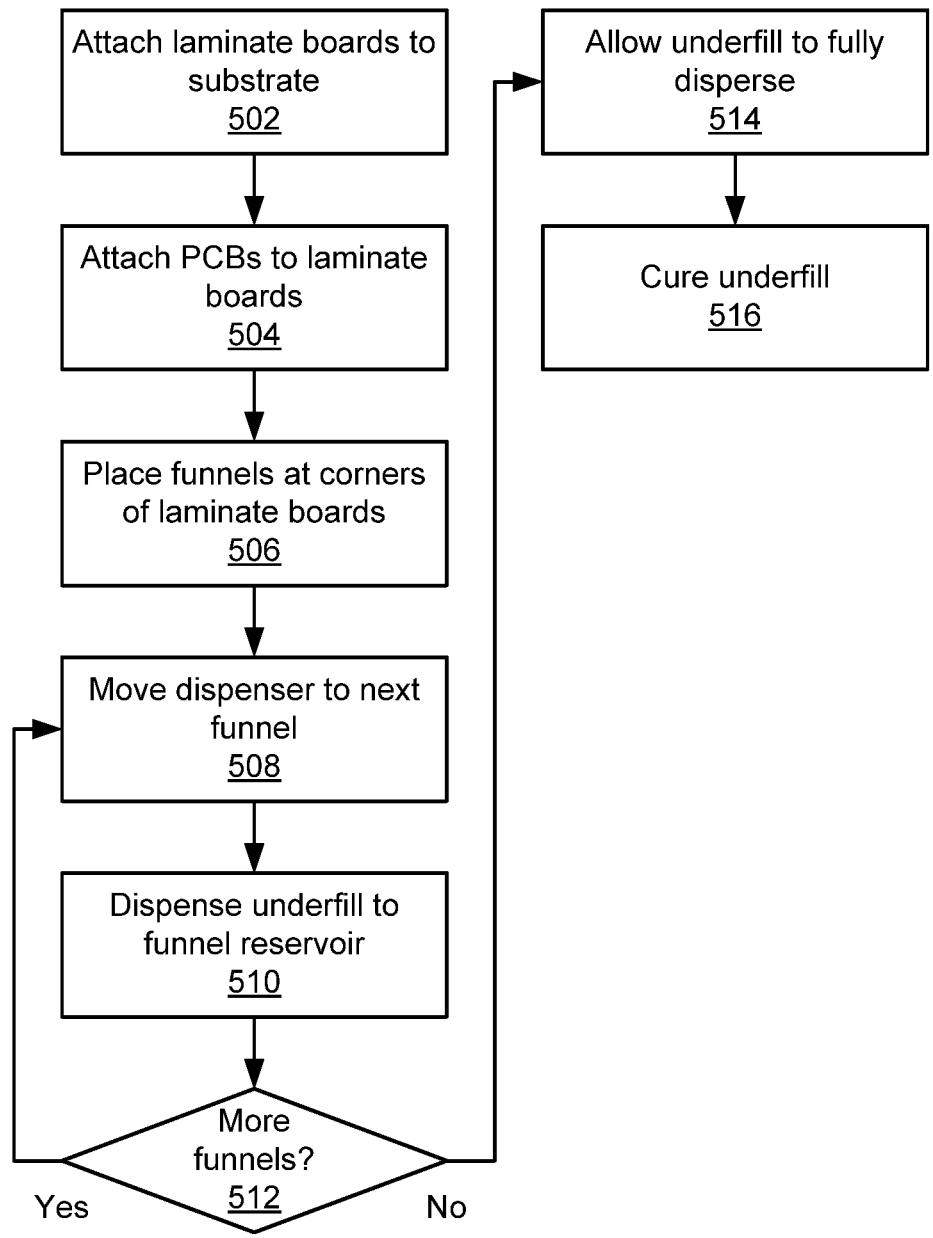
FIG. 5 is a block/flow diagram of a method for forming a void-free underfill layer in accordance with the present principles.

Referring now to FIG. 5, a method of depositing an underfill 202 is shown. Block 502 attaches the laminate boards 108 to the substrate 104 using the solder contact points 106. Block 504 then attaches the PCBs 112 to the laminate boards 108 using BGAs 110. Block 506 places the funnels 116 at the corners of the laminate boards 108 as shown above, such that the funnels 116 are evenly distributed across the wafer 100 and such that an output of the funnels 116 is at a height appropriate to provide underfill material underneath the laminate boards 108. It should be noted that this process is distinct from that employed by conventional underfill techniques, which would provide underfill material immediately after the placement of the laminate and before the placement of the PCBs.

Block 508 moves the dispenser nozzle 404 to the position of the first funnel 116 and block 510 fills the funnel's reservoir with underfill material. Block 510 may fill the funnel 116 with a predetermined amount of underfill material or may, alternatively, sense when the funnel 116 is full and cease dispensing at that time. Block 512 then determines whether there are funnels that have not been filled yet. If so, processing returns to block 508 which moves the dispenser nozzle 404 to the position of the next funnel 116. If not, block 514 waits for the underfill material in the funnel reservoirs to fully disperse between the laminate boards 108 and the substrate 104. Once that has occurred, e.g., by a timed delay or by observing when the funnel reservoirs are empty, block 516 cures the underfill material after the funnels 116 are removed. The curing process may include, for example, heating the wafer 100 to a curing temperature for a predetermined period of time.

Figure 6:
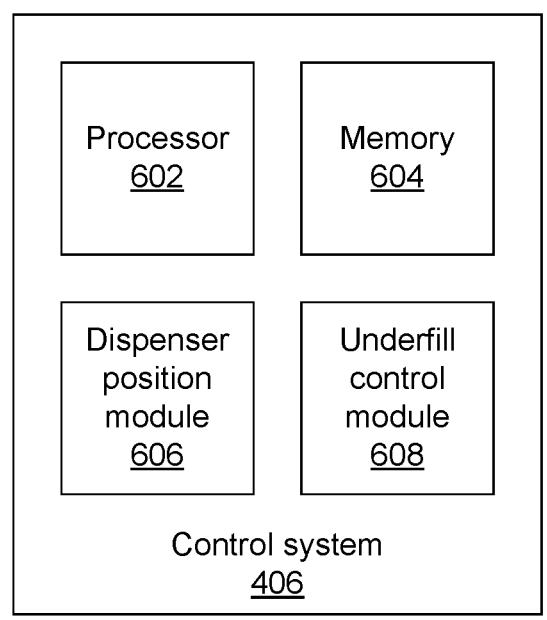
FIG. 6 is a block diagram of an underfill deposition control system in accordance with the present principles.

Referring now to FIG. 6, an abstract view of the control system 406 is shown. The control system 406 includes a hardware processor 602 and memory 604. In addition, the control system 406 includes one or more functional modules that may, for example, include software instructions that are stored in memory 604 and executed by the processor 602. Alternatively, the functional modules may be implemented as one or more discrete hardware components in the form of, e.g., application specific integrated chips or field programmable gate arrays.

In particular, the control system 406 includes a dispenser position module 606. The dispenser position module 606 issues commands to the dispenser 402 to change the position of the dispenser 402 over the wafer 100. The dispenser position module 606 may issue these commands based on a predetermined set of movements, stored in memory 604, or may adaptively locate funnels 116 using one or more sensor inputs. It should be recognized that the dispenser position module 606 will therefore have at least one external interface to components outside the control system 406, including a command interface to the dispenser 402 and optionally a sensor interface to the one or more sensors.

In addition, the control system 406 includes an underfill control module 608. The underfill control module 608 issues commands to the dispenser 402 to dispense underfill material through the nozzle 404 into each of the funnels 116. The underfill control module 608 therefore interacts with the dispenser position module 606 to determine when the nozzle 404 is positioned above a funnel 116. The underfill control module 608 may dispense a predetermined volume of underfill material into each funnel 116 or may, alternatively, sense how much material is present in each funnel 116 and dispense underfill material until the funnel reservoir is full. Toward this end the underfill control module 608 will have at least one external interface to components outside the control system 406, including a command interface to the dispenser 402 and optionally a sensor interface to one or more sensors.

Figure 7:
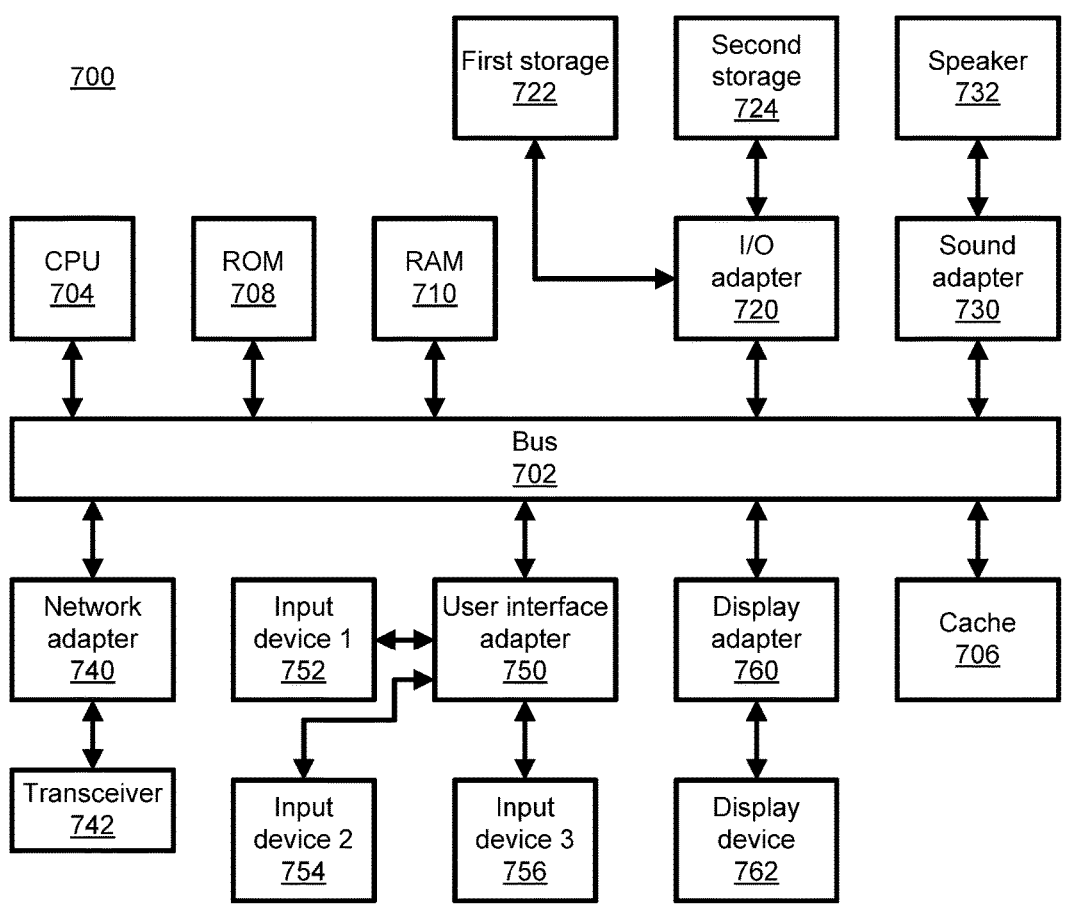
FIG. 7 is a block diagram of a processing system in accordance with the present principles.

Referring now to FIG. 7, an exemplary processing system 700 is shown which may represent the control system 406. The processing system 700 includes at least one processor (CPU) 704 operatively coupled to other components via a system bus 702. A cache 706, a Read Only Memory (ROM) 708, a Random Access Memory (RAM) 710, an input/output (I/O) adapter 720, a sound adapter 730, a network adapter 740, a user interface adapter 750, and a display adapter 760, are operatively coupled to the system bus 702.

A first storage device 722 and a second storage device 724 are operatively coupled to system bus 702 by the I/O adapter 720. The storage devices 722 and 724 can be any of a disk storage device (e.g., a magnetic or optical disk storage device), a solid state magnetic device, and so forth. The storage devices 722 and 724 can be the same type of storage device or different types of storage devices.

A speaker 732 is operatively coupled to system bus 702 by the sound adapter 730. A transceiver 742 is operatively coupled to system bus 702 by network adapter 740. A display device 762 is operatively coupled to system bus 702 by display adapter 760.

A first user input device 752, a second user input device 754, and a third user input device 756 are operatively coupled to system bus 702 by user interface adapter 750. The user input devices 552, 754, and 756 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 752, 754, and 556 can be the same type of user input device or different types of user input devices. The user input devices 752, 754, and 756 are used to input and output information to and from system 700.

Of course, the processing system 700 may also include other elements (not shown), as readily contemplated by one of skill in the art, as well as omit certain elements. For example, various other input devices and/or output devices can be included in processing system 700, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 700 are readily contemplated by one of ordinary skill in the art given the teachings of the present principles provided herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 8:
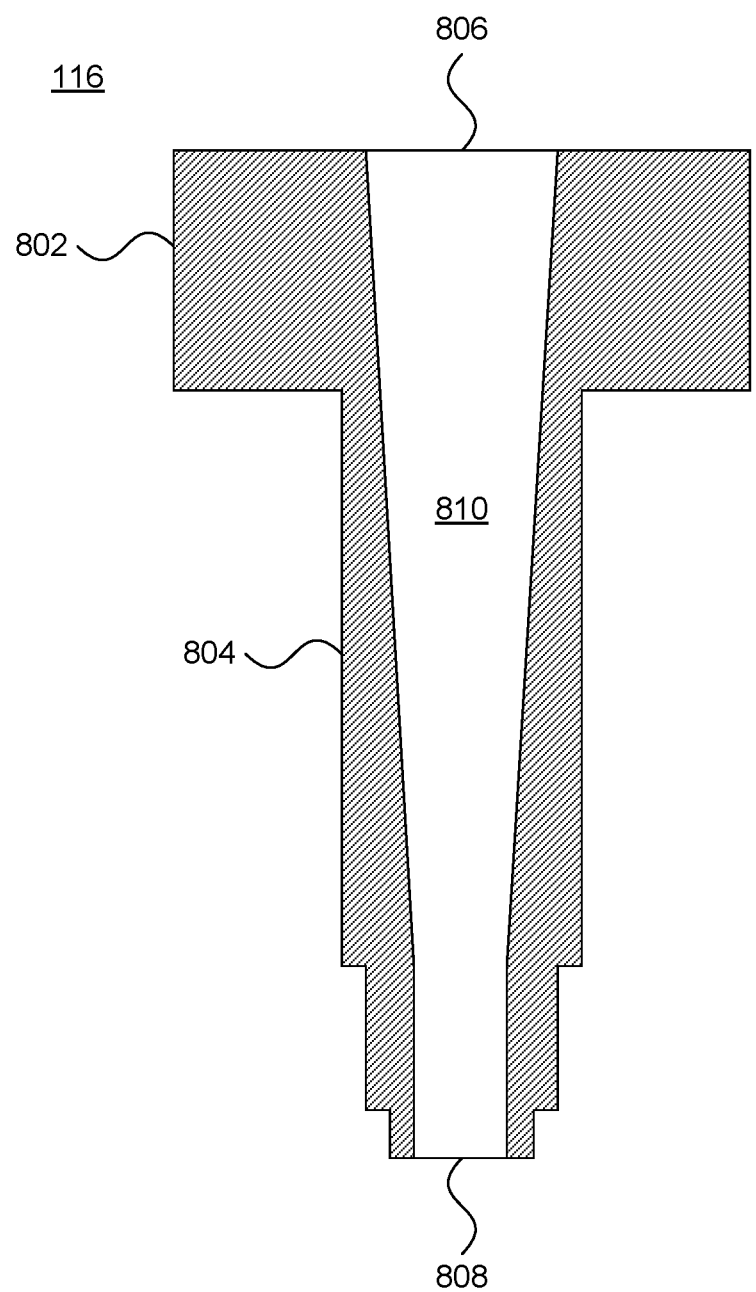
FIG. 8 is a cross-sectional diagram of an underfill deposition funnel in accordance with the present principles.

Referring now to FIG. 8, a cross-sectional view of a funnel 116 is shown. The funnel 116 includes a broad head 802. The head 802 has a width configured to rest athwart an opening between a set of adjacent PCBs 112. Below the head 802 is a neck 804. The neck 804 may have multiple different widths, allowing the neck 804 to fit between the laminates 108 and any other layers that may constrict the opening below the PCBs 112. The neck 804 has a length configured to reach below the lowermost layer (e.g., the laminates 108) with a space above the substrate 104.

The funnel 116 has a horizontal surface that contacts the horizontal surface of the laminate 108 and thereby creates a seal that prevents underfill up flow into the space between the laminate 108 and PCB 112. Additionally, the vertical extension of the funnel tip below the top surface of the laminate 108 could be tapered so as to provide a snug fit between the outside surface of the funnel and the vertical side wall of the laminate 108.

The funnel 116 has an interior space defined by an input 806 having a first diameter and an output 808 having a second diameter that is smaller than the first diameter. An internal reservoir 810 connects the input 806 to the output 808. The diameter of the output 808 is configured to limit the flow of an underfill material to prevent the underfill material from overflowing the laminates 108 or escaping down the channels between laminates 108. A volume of the reservoir 810 is configured to hold an amount of underfill material sufficient to fully penetrate underneath the laminates 108.

It should be understood that the funnel 116 depicted is intended to be exemplary, and the proportions shown are not intended to be limiting. In particular, the dimensions of the head 802 and the neck 804 will be dictated by the dimensions of the nearby laminates 108 and PCBs 112, while the dimensions of the input 806, the output 808, and the reservoir 810 will be dictated by the properties of the underfill material, the properties of the dispenser 402 and nozzle 404, and the space of the gap into which the underfill will be deposited.

Other configurations of funnel 116 are also possible. In particular, it is contemplated that free-standing funnels (e.g., funnels lacking head 802) may be used if the neck 804 is sized to fit snugly between the PCBs 112 or laminates 108. Alternatively, a separate fixture or jig may be placed over the PCBs 112 with the funnels 116 positioned therein.

Having described preferred embodiments of underfills using funnels (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for underfilling an array of objects on a substrate, comprising:
   forming a void-free layer of underfill material between a substrate and an array of multiple objects positioned on the substrate; and
   curing the void-free layer of underfill material to form a protective cured underfill layer that provides structural support to connections between the objects and the substrate.

2. The method of claim 1, further comprising filling funnel reservoirs with underfill material at multiple points on the substrate.

3. The method of claim 2, wherein each funnel comprises a broad head configured to rest on neighboring objects and having a length configured to dispense underfill material to the layer of underfill material.

4. The method of claim 2, wherein filling the funnel reservoirs comprises filling each funnel reservoir in sequence, such that underfill material continues to dispense from previously filled funnels while subsequent funnel reservoirs are being filled.

5. The method of claim 2, wherein filling the funnel reservoirs comprises dispensing a predetermined volume of underfill material in to each respective funnel reservoir, said predetermined volume being sufficient to underfill neighboring objects without overflowing onto other layers.

6. The method of claim 1, wherein the substrate is a wafer and the objects are laminates.

7. The method of claim 1, wherein the substrate is a laminate and the objects are chips.

8. A multi-laminate wafer, comprising:
   an array of a plurality of laminates individually bonded to a first layer of a wafer; and
   a void-free layer of cured underfill material that completely fills a space between each of the plurality of laminates and the first layer.

9. The multi-laminate wafer of claim 8, wherein the cured underfill material has a glass transition temperature of about 80° C., a coefficient of thermal expansion of about 35 ppm/° C., and a modulus of elasticity of about 7.2 GPa.

10. A multi-laminate wafer, comprising:
    an array of a plurality of laminates individually bonded to a first layer of a wafer; and
    a void-free layer of cured underfill material that completely fills a space between each of the plurality of laminates and the first layer and that does not extend between the plurality of laminates and one or more upper circuit layers.

11. The multi-laminate wafer of claim 10, wherein the cured underfill material has a glass transition temperature of about 80° C., a coefficient of thermal expansion of about 35 ppm/° C., and a modulus of elasticity of about 7.2 GPa.

* * * * *